United States Patent
Whetten et al.

(10) Patent No.: US 9,606,157 B2
(45) Date of Patent: Mar. 28, 2017

(54) SHIELDING EFFECTIVENESS DETERMINATION

(71) Applicant: The Boeing Company, Chicago, IL (US)

(72) Inventors: Dennis Whetten, Edmonds, WA (US); Dennis M. Lewis, Mill Creek, WA (US); Kenneth P. Kirchoff, Redmond, WA (US)

(73) Assignee: THE BOEING COMPANY, Chicago, IL (US)

( * ) Notice: Subject to any disclaimer, the term of this patent is extended or adjusted under 35 U.S.C. 154(b) by 949 days.

(21) Appl. No.: 13/686,646

(22) Filed: Nov. 27, 2012

(65) Prior Publication Data
US 2014/0149074 A1    May 29, 2014

(51) Int. Cl.
*G01R 29/08*    (2006.01)
*G01R 31/00*    (2006.01)
*G06F 11/34*    (2006.01)

(52) U.S. Cl.
CPC ........ *G01R 29/0835* (2013.01); *G01R 31/008* (2013.01); *G06F 11/3466* (2013.01)

(58) Field of Classification Search
CPC .................................................. G01R 29/0835
USPC ............................................................ 702/71
See application file for complete search history.

(56) References Cited

U.S. PATENT DOCUMENTS

| | | | | |
|---|---|---|---|---|
| 6,255,830 B1 * | 7/2001 | Rollin | ........... | H05K 9/0069 |
| | | | | 174/387 |
| 6,526,365 B1 * | 2/2003 | Marino | ........... | G01R 27/28 |
| | | | | 340/870.14 |
| 6,529,157 B1 * | 3/2003 | Mensa | ........... | G01S 7/412 |
| | | | | 342/173 |
| 7,554,339 B2 | 6/2009 | Lewis | | |
| 7,804,445 B1 * | 9/2010 | Fiore | ........... | G01S 3/74 |
| | | | | 342/146 |
| 2004/0077943 A1 * | 4/2004 | Meaney | ........... | A61B 5/05 |
| | | | | 600/430 |
| 2005/0113141 A1 * | 5/2005 | Felter | ........... | H04B 1/709 |
| | | | | 455/562.1 |
| 2012/0038506 A1 * | 2/2012 | Kanamoto | ........... | G01S 3/74 |
| | | | | 342/158 |
| 2012/0235849 A1 * | 9/2012 | Tatoian | ........... | G01S 13/0209 |
| | | | | 342/21 |

OTHER PUBLICATIONS

Kikuchi et al., A Proposal for Searching for Electromagnetic Wave Sources by Using a Synthetic Aperture Technique, Electronics and Communications in Japan, Part 1, vol. 70, No. 3, 1987.*

(Continued)

*Primary Examiner* — Mischita Henson
*Assistant Examiner* — Michael Dalbo
(74) *Attorney, Agent, or Firm* — Toler Law Group, PC

(57) ABSTRACT

In one embodiment a method to evaluate a shielding effectiveness of an enclosed structure, comprising collecting synthetic aperture data from an electromagnetic transmission originating from within the enclosed structure to generate a synthetic aperture dataset, performing angular spectrum processing on the synthetic aperture dataset to generate an angle of arrival dataset and determining a shielding effectiveness parameter from the angle of arrival dataset. Other embodiments may be described.

20 Claims, 4 Drawing Sheets

(56) References Cited

OTHER PUBLICATIONS

Curry, M.; Koala, B.; Ciccotosto, M.; Kuga, Y., "Indoor angle of arrival using wide-band frequency diversity with experimental results and EM propagation modeling," in Antennas and Propagation for Wireless Communications, 2000 IEEE-APS Conference on , vol., No., pp. 65-68, 2000, doi: 10.1109/APWC.2000.900143.*
Agilent Technologies, Spectrum Analyzer Basics, 2004, http://literature.agilent.com/litweb/pdf/5965-7920E.pdf.*

* cited by examiner

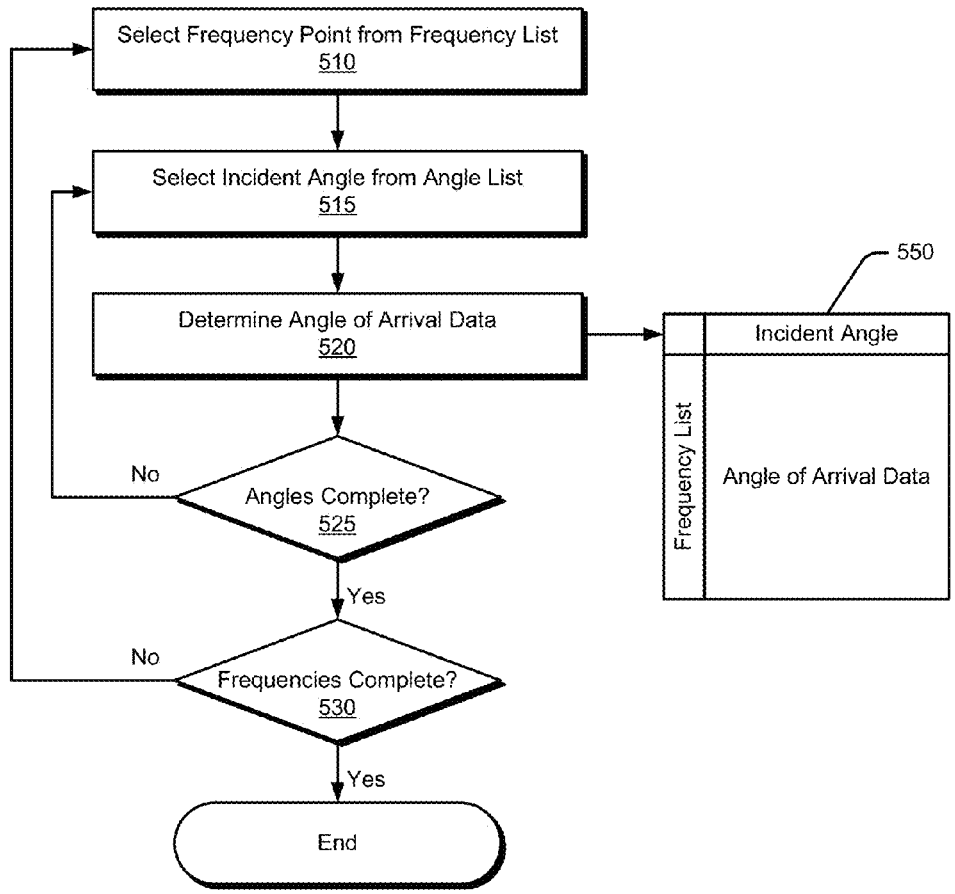
FIG. 5
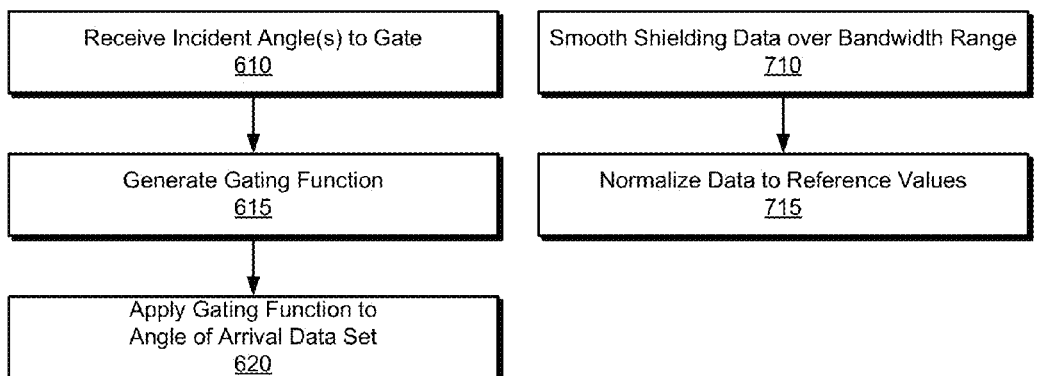
FIG. 6
FIG. 7

SHIELDING EFFECTIVENESS DETERMINATION

FIELD OF THE DISCLOSURE

This invention relates to testing and evaluation techniques for radiofrequency (RF) shielding in enclosed structures, and more particularly to objects and to systems and methods to determine shielding effectiveness of structures such as aircraft.

BACKGROUND

Various regulatory bodies, e.g., the Federal Aviation Administration (FAA) maintain standards for shielding RF emissions from aircraft and require aircraft to be tested periodically for compliance with the standards. Existing test methods require high RF transmission power to achieve sufficient dynamic range to measure shielding effectiveness. Such high RF transmission power require expensive amplifiers which can limit the availability of frequency spectrum required for the test. The limitations on frequency spectrum available can limit the accuracy of shielding effectiveness tests. Accordingly, systems and methods to test enclosed structures for RF shielding effectiveness may find utility.

SUMMARY

In one embodiment there is provided a method to evaluate a shielding effectiveness of an enclosed structure, comprising collecting synthetic aperture data from an electromagnetic transmission originating from within the enclosed structure to generate a synthetic aperture dataset, performing angular spectrum processing on the synthetic aperture dataset to generate an angle of arrival dataset and determining a shielding effectiveness parameter from the angle of arrival dataset.

In another embodiment there is provided a computer-based system to evaluate a shielding effectiveness of an enclosed structure, comprising a non-transitory memory, a computer-based processing device coupled to the non-transitory memory and logic instruction stored in the non-transitory memory module which, when executed by the processing device, configures the processing device to perform operations, comprising collecting synthetic aperture data from an electromagnetic transmission originating from within the enclosed structure to generate a synthetic aperture dataset, performing angular spectrum processing on the synthetic aperture dataset to generate an angle of arrival dataset, and determining a shielding effectiveness parameter from the angle of arrival dataset.

In another embodiment there is provided a computer program product comprising logic instructions stored in a non-transitory memory module which, when executed by a processing device, configures the processing device to evaluate a shielding effectiveness of an enclosed structure by performing operations, comprising collecting synthetic aperture data from an electromagnetic transmission originating from within an enclosed structure to generate a synthetic aperture dataset, performing angular spectrum processing on the synthetic aperture dataset to generate an angle of arrival dataset, and determining a shielding effectiveness parameter from the angle of arrival dataset.

The features, functions and advantages discussed herein can be achieved independently in various embodiments described herein or may be combined in yet other embodiments, further details of which can be seen with reference to the following description and drawings.

BRIEF DESCRIPTION OF THE DRAWINGS

The detailed description is described with reference to the accompanying figures.

FIGS. 3-7 are flowcharts illustrating operations in a method for shielding determination, according to embodiments.

DETAILED DESCRIPTION

Described herein are exemplary systems and methods for shielding effectiveness determination. Embodiments described here provide systems, methods, and computer program products for determining the shielding effectiveness of an enclosed structured, e.g., an aircraft. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
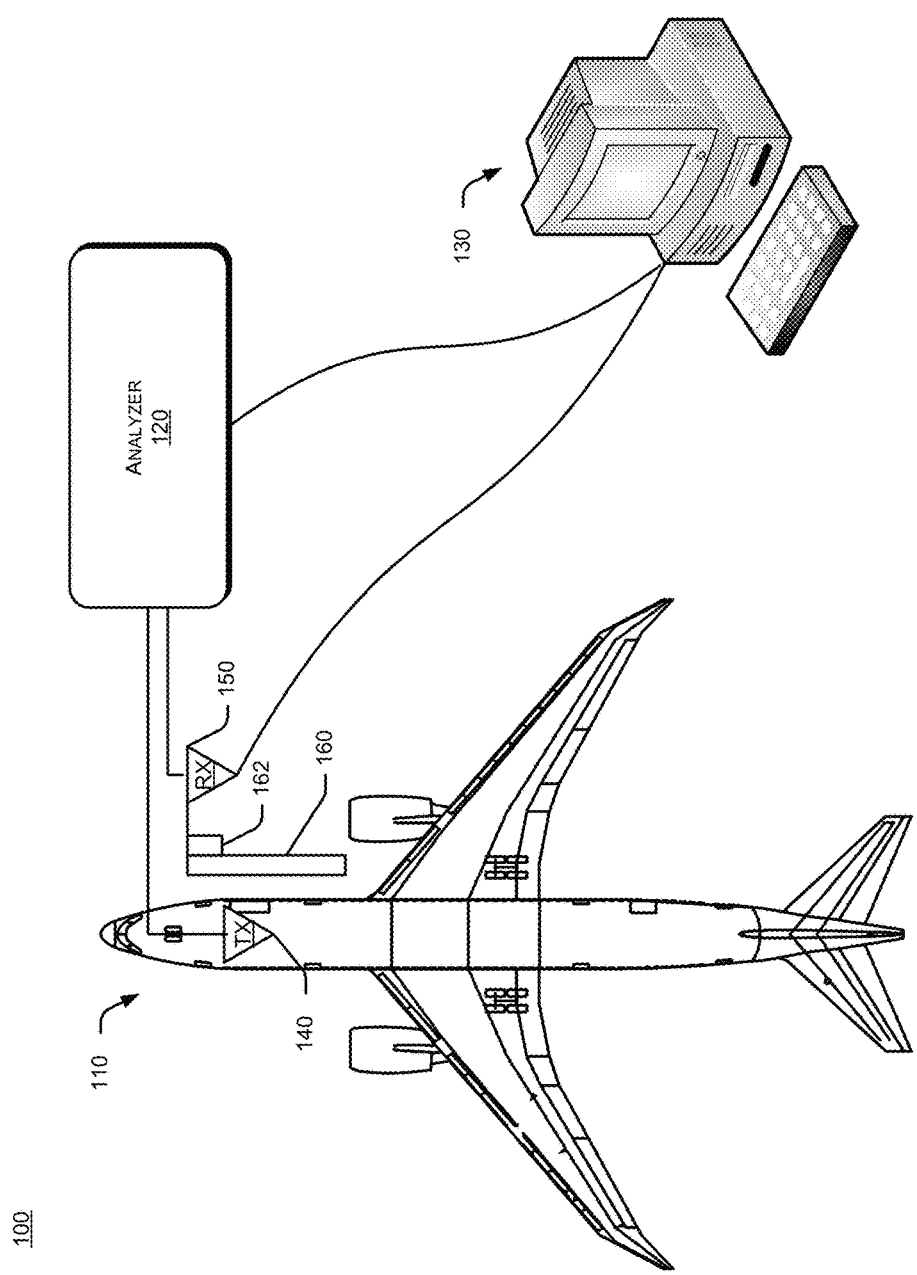
FIG. 1 is a schematic, views of a system for shielding effectiveness determination in accordance with some embodiments.

FIG. 1 is a schematic, views of a system for shielding effectiveness determination in accordance with some embodiments. Referring to FIG. 1, in one embodiment a system 100 comprises an enclosed structure, e.g., an aircraft 110, an analyzer 120, and a computer-based system 130 coupled to the analyzer. A transmitter 140 is positioned inside the aircraft 110. A receiver 150 may be mounted to a track 160 which extends adjacent a portion of the aircraft 110. A linear actuator 162 may coupled to the receiver 150 to translate the receiver 150 along a predetermined path proximate the aircraft 110.

In some embodiments aircraft 110 may be embodied as commercial aircraft, e.g. commercial jet. In alternate embodiments aircraft 110 may be embodied as a military aircraft or the like. Further, one skilled in the art will recognize that while the enclosed structure is depicted herein as an aircraft, the specific embodiment of the enclosed structure is not critical. The systems and methods described herein may be applied to any enclosed structure including land-based vehicles, waterborne vehicles, buildings or other enclosures.

In some embodiments the analyzer 120 may be embodied as a N5234A performance network analyzer commercially available from Agilent in Santa Clara, Calif., USA.

Figure 2:
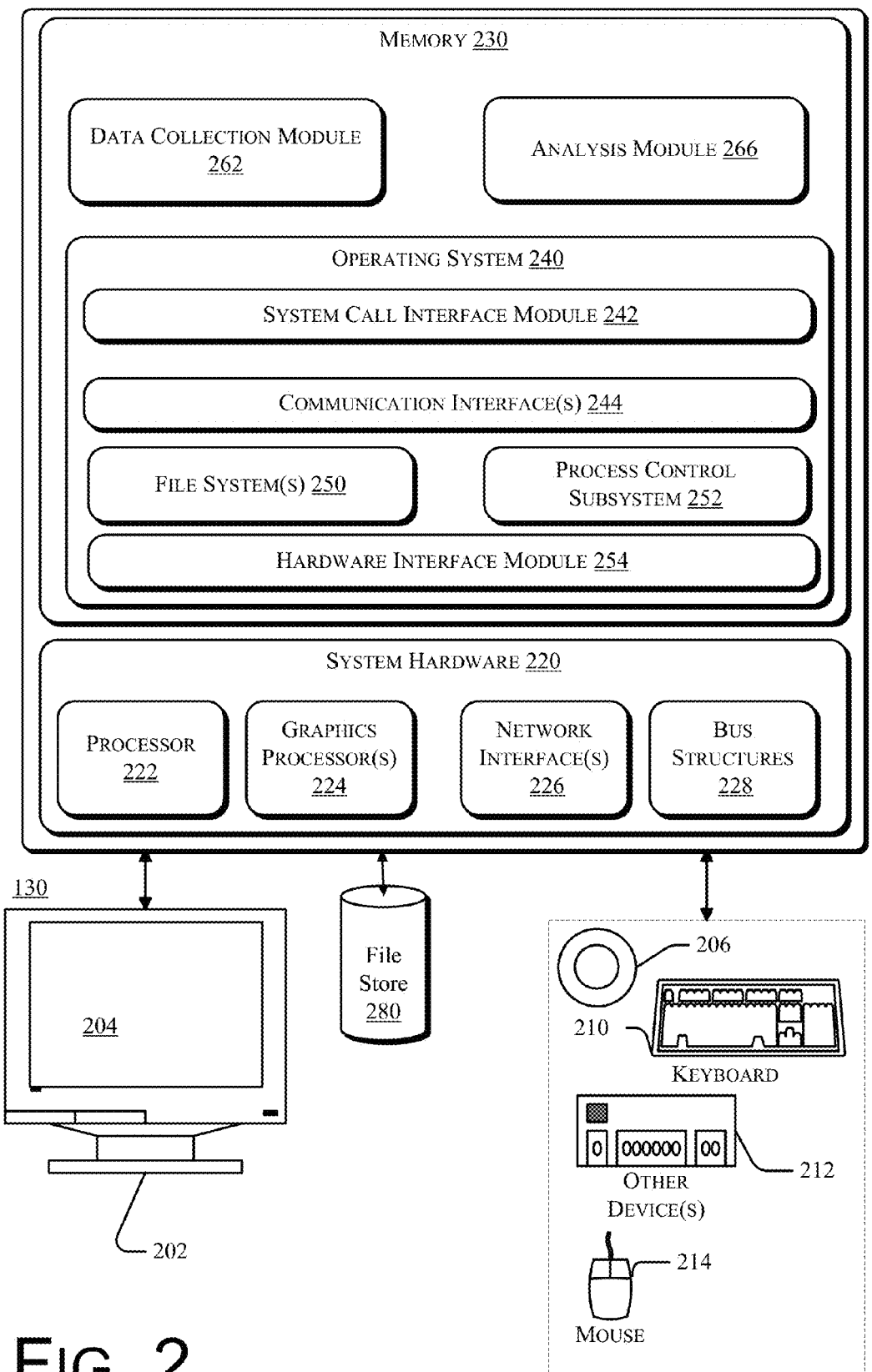
FIG. 2 is a schematic illustration of a computing system in which portions of a system for shielding determination may be implemented according to embodiments.

FIG. 2 is a schematic illustration of a computing system 130 in which portions of a system for shielding determination may be implemented according to embodiments. Referring to FIG. 2, in one embodiment, system 130 may include one or more accompanying input/output devices including a display 202 having a screen 204, one or more speakers 206, a keyboard 210, one or more other I/O device(s) 212, and a mouse 214. The other I/O device(s) 212 may include a touch screen, a voice-activated input device, a track ball, and any other device that allows the system 180 to receive input from a user.

The system 180 includes system hardware 220 and memory 230, which may be implemented as random access memory and/or read-only memory. A file store 280 may be communicatively coupled to system 180. File store 280 may be internal to computing device 208 such as, e.g., one or more hard drives, CD-ROM drives, DVD-ROM drives, or other types of storage devices. File store 280 may also be external to computer 208 such as, e.g., one or more external hard drives, network attached storage, or a separate storage network.

System hardware 220 may include one or more processors 222, at least two graphics processors 224, network interfaces 226, and bus structures 228. In one embodiment, processor 222 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processors 224 may function as adjunct processors that manage graphics and/or video operations. Graphics processors 224 may be integrated onto the motherboard of computing system 200 or may be coupled via an expansion slot on the motherboard.

In one embodiment, network interface 226 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 228 connect various components of system hardware 228. In one embodiment, bus structures 228 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), a General Purpose Interface Bus (GPIB) and Small Computer Systems Interface (SCSI).

Memory 230 may include an operating system 240 for managing operations of computing device 208. In one embodiment, operating system 240 includes a hardware interface module 254 that provides an interface to system hardware 220. In addition, operating system 240 may include a file system 250 that manages files used in the operation of computing device 208 and a process control subsystem 252 that manages processes executing on computing device 130.

Operating system 240 may include (or manage) one or more communication interfaces that may operate in conjunction with system hardware 120 to transceive data packets and/or data streams from a remote source. Operating system 240 may further include a system call interface module 242 that provides an interface between the operating system 240 and one or more application modules resident in memory 230. Operating system 240 may be embodied as a UNIX operating system or any derivative thereof (e.g., Linux, Solaris, etc.) or as a Windows® brand operating system, or other operating systems.

In various embodiments, the system 130 may be embodied as a personal computer, a laptop computer, a personal digital assistant, a mobile telephone, an entertainment device, or another computing device.

In one embodiment, memory 230 includes one or more logic modules embodied as logic instructions encoded on a tangible, non transitory memory to impart functionality to the system 280. The embodiment depicted in FIG. 2 comprises a data collection module 262, and an analysis module 266 Additional details about the process and operations implemented by these modules are described with reference to FIGS. 3-7 below.

In operation, the computer based system 130 may be employed to determine a shielding effectiveness of an enclosed structure, e.g., an aircraft 110. In brief overview, In embodiments described herein an RF transmitter may be positioned within an aircraft and an RF receiver may be positioned outside the aircraft and configured to move along a predetermined path to a plurality of locations. At each location the transmitter transmits an RF signal which sweeps through a plurality of frequencies within a predetermined frequency range. Information about the magnitude and phase of the RF signal and the RF signal received by the receiver are provided to an analyzer. A computer-based system coupled to the analyzer receives data from the analyzer and processes the data to determine a shielding effectiveness of the aircraft 110.

Figure 3:
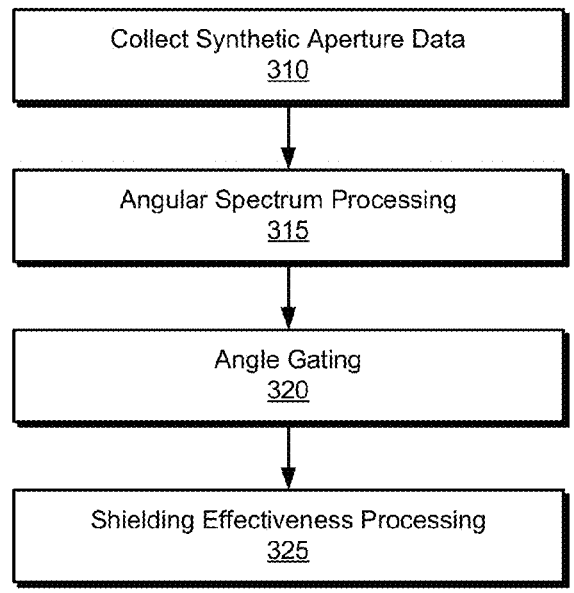

In greater detail, and referring to FIG. 3, in some embodiments a method to evaluate a shielding effectiveness of an enclosed structure comprises collecting synthetic aperture data (operation 310) from an electromagnetic transmission originating from within the enclosed structure to generate a synthetic aperture dataset, performing angular spectrum processing (operation 315) on the synthetic aperture dataset to generate an angle of arrival dataset, optionally applying a gating function to the angle of arrival dataset (operation 320) and determining (operation 325) a shielding effectiveness parameter from the angle of arrival dataset. These operations will be described in greater detail with reference to FIGS. 4-7. In some embodiments the operations depicted in FIG. 4 may be implemented by the data collection module 262, while the operations depicted in FIGS. 5-7 may be implemented by the analysis module 266.

Figure 4:
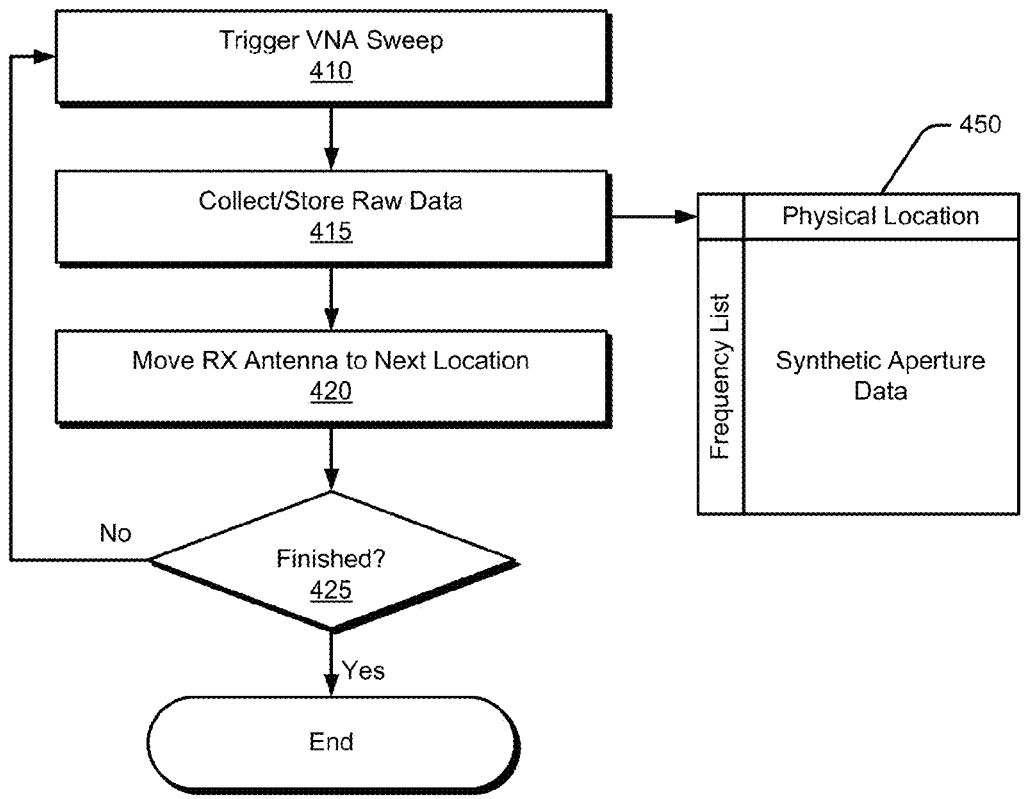

FIG. 4 is a flowchart illustrating operations in the method to collect synthetic aperture data (operation 310) in accordance with some embodiments. Referring to FIG. 4, at operation 410 a vector network analyzer (VNA) sweep is triggered. As described above, in a test environment an RF transmitter is positioned within the enclosed structure and an RF receiver is positioned at a first position outside the enclosed structure, e.g., on track 160. During a VNA sweep the RF transmitter transmits an RF signal from within the enclosed structure, wherein the signal sweeps through a plurality of frequencies within a predetermined frequency range. By way of example, RF transmitter 140 may transmit an RF signal that sweeps through a frequency range between 500 MHz and 20 GHz.

Synthetic aperture data from the signal transmitted from the transmitter 140 is then collected. By way of example, in some embodiments the transmitter 140 and the receiver are coupled to analyzer 120 and to computer-based system 130. The transmitter 140 provides the analyzer 120 and computer-based system 130 with information about the magnitude and phase of the signal transmitted by the transmitter 140. Similarly, the receiver 150 provides the analyzer 120 and computer-based system 130 with information about the magnitude and phase of the signal received by the receiver 150. Using this information at least one of the analyzer 120 or the computer-based system 130 may determine a magnitude difference between the RF signal transmitted from within the enclosure by the transmitter 140 and the RF signal received at the receiver 150 and a phase difference between the RF signal transmitted from within the enclosure by the transmitter 140 and the RF signal received at the receiver 150. This data may be stored (operation 415) in a synthetic aperture data table 450 which may reside in a computer-readable memory medium, e.g., memory 230 and/or file store 280 of system 130.

The linear actuator 162 then moves the receiver (operation 420) from a first position on the track 160 to a second position, different from the first position, and if the receiver is not at the end of the track (operation 425) then the transmitter is activated again. Thus, operations 410-420 define a data collection process which is repeated at a plurality of locations along the track to construct a synthetic aperture data table 450.

FIG. 5 is a flowchart which illustrates one embodiment of a method for angular spectrum processing (operation 315), according to embodiments. By way of overview, in some embodiments the synthetic aperture data stored in table 450 may be converted to angle of arrival data by perform a mathematical transform over the physical dimension to convert it to the angular dimension, resulting in a 2-dimensional array of complex values as a function of frequency and incident angle. Referring to FIG. 5, at operation 510 a first frequency point is selected from the frequencies in the synthetic aperture data table 450, and at operation 515 an incident angle is selected from an incident angle list.

At operation 520 the angle of arrival data is determined for the combination of the selected frequency and incidence angle. By way of example, in some embodiments a transform factor, t, is determined as a function of physical location, x, incident angle, θ, frequency, f, the speed of light, c, and window, w:

$$t(x, f, \theta) = w(x)e^{\left(-j+2\pi+x+f+\frac{\sin(\theta)}{c}\right)}$$  EQ 1

Exemplary windowing functions, w, include rectangular, Chebyshev, Hamming, etc., which may be used to reduce sidelobe levels without compromising the signal. The use of windowing functions is optional and the process works without explicitly using any window function.

Next the one-dimensional array of data determined by the transform factor function (EQ 1) is multiplied by the one-dimensional array data and summed, as indicated in Equation 2 to generate an angle of arrival value for a single incident angle and frequency. EQ 2:

$$AoA\ Value(\theta_m, f_m) = (d(f_m, x_0) * t(x_0, f_m, \theta_n) + d(f_m, x_1) * t(x_1, f_m, \theta_n) + d(f_m, x_2) * t(x_2, f_m, \theta_n) + \ldots)$$

If, at operation 525, there are more incident angles to determine then control passes back to operation 515. Similarly, if at operation 530 there are more frequencies to determine then control passes back to operation 510. This process is repeated for every frequency and incident angle.

Thus, operations 510-530 define a data transform process which transform the data in the synthetic aperture data table 450 to angle of arrival data in the angle of arrival dataset 550 which may reside in a computer-readable memory medium, e.g., memory 230 and/or file store 280 of system 130.

FIG. 6 is a flowchart which illustrates one embodiment of a method for angle gating (operation 320), according to embodiments. By way of overview, in some embodiments shielding failures at a known incident angle may be omitted from shielding effectiveness values by gating the angular spectrum. Referring to FIG. 6, at operation 610 one or more incident angles to gate are received. By way of example, in some embodiments a test operator may input incident angles to gate. At operation 615 a gating function is generated, and at operation 620 the gating function is applied to the angle of arrival data set.

FIG. 7 is a flowchart which illustrates one embodiment of a method for shielding effectiveness processing (operation 325), according to embodiments. At operation 710 the shielding data may be smoothed over a relevant bandwidth range. At operation 715 a shielding effectiveness parameter may be determined by comparing the measured values to reference values for test locations and frequency combinations (i.e., reference−measured=shielding effectiveness parameter). Suitable Reference values may be generated by either testing the same condition without the structure, or through analysis and/or simulation. The shielding effectiveness parameter may be provided to a human operator using the system or to another evaluation program used to evaluate the aircraft 110.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method comprising:
    transmitting a first electromagnetic transmission from a transmitter within an enclosed structure;
    collecting first synthetic aperture data based on the first electromagnetic transmission as received at a receiver while the receiver is at a first position outside of the enclosed structure;
    moving, via a linear actuator, the receiver along a track from the first position to a second position outside of the enclosed structure;
    transmitting a second electromagnetic transmission from the transmitter;
    collecting second synthetic aperture data based on the second electromagnetic transmission as received at the receiver while the receiver is at the second position;
    performing angular spectrum processing on the first synthetic aperture data and the second synthetic aperture data to generate an angle of arrival dataset;
    receiving input identifying an incident angle associated with a known shielding failure;
    applying, based on the input, a gating function to the angle of arrival dataset to determine a gated angle of arrival dataset; and determining a shielding effectiveness parameter of the enclosed structure based on the gated angle of arrival dataset.

2. The method of claim 1, wherein the first electromagnetic transmission is transmitted via sweeping through a plurality of frequencies in a frequency range.

3. The method of claim 2, wherein the second electromagnetic transmission is transmitted via sweeping through the plurality of frequencies.

4. The method of claim 1, wherein the first synthetic aperture data includes a first phase difference between the first electromagnetic transmission as transmitted by the transmitter and the first electromagnetic transmission as received by the receiver, and wherein the second synthetic aperture data includes a second phase difference between the second electromagnetic transmission as transmitted by the transmitter and the second electromagnetic transmission as received by the receiver.

5. The method of claim 1, wherein the synthetic aperture data comprises a two-dimensional array of complex values, wherein performing angular spectrum processing on the synthetic aperture dataset comprises multiplying a one dimensional array of the complex values for a single frequency by a transform factor which is a function of a receiver location, an incident angle, a frequency, and a window function.

6. The method of claim 1, wherein the first synthetic aperture data includes a first magnitude difference between the first electromagnetic transmission as transmitted by the transmitter and the first electromagnetic transmission as received by the receiver.

7. The method of claim 6, wherein the second synthetic aperture data includes a second magnitude difference between the second electromagnetic transmission as transmitted by the transmitter and the second electromagnetic transmission as received by the receiver.

8. A system comprising:
a transmitter configured to be positioned within an enclosed structure;
a receiver;
a linear actuator coupled to the receiver, the linear actuator configured to move the receiver along a track from a first position outside of the enclosed structure to a second position outside of the enclosed structure;
a processor;
a non-transitory memory storing instructions which, when executed by the processor, cause the processor to perform operations comprising:
initiating transmission of a first electromagnetic transmission from the transmitter;
collecting first synthetic aperture data based on the first electromagnetic transmission as received at the receiver while the receiver is at the first position;
initiating the linear actuator to move the receiver from the first position to the second position;
initiating transmission of a second electromagnetic transmission from the transmitter;
collecting second synthetic aperture data based on the second electromagnetic transmission as received at the receiver while the receiver is at the second position;
performing angular spectrum processing on the first synthetic aperture data and the second synthetic aperture data to generate an angle of arrival dataset;
receiving input identifying an incident angle associated with a known shielding failure;
applying, based on the input, a gating function to the angle of arrival dataset to determine a gated angle of arrival dataset; and
determining a shielding effectiveness parameter of the enclosed structure based on the gated angle of arrival dataset.

9. The system of claim 8, wherein the first synthetic aperture data includes a first phase difference between the first electromagnetic transmission as transmitted by the transmitter and the first electromagnetic transmission as received by the receiver.

10. The system of claim 8, wherein the track is parallel to a side of the enclosed structure.

11. The system of claim 8, wherein the first electromagnetic transmission is transmitted via sweeping through a plurality of frequencies in a frequency range.

12. The system of claim 8, wherein the synthetic aperture data comprises a two-dimensional array of complex values, and wherein performing angular spectrum processing on the synthetic aperture dataset comprises multiplying a one dimensional array of the complex values for a single frequency by a transform factor which is a function of a receiver location, an incident angle, a frequency, and a window function.

13. The system of claim 8, wherein the second electromagnetic transmission is transmitted in response to the receiver reaching the second position, and wherein the enclosed structure includes an aircraft.

14. The system of claim 8, wherein the operations further comprise initiating the linear actuator to move the receiver from the second position to a third position on the track, and wherein the angular spectrum processing is performed after the receiver reaches the third position.

15. A non-transitory computer-readable memory storing instructions which, when executed by a processor, cause the processor to perform operations comprising:
initiating transmission of a first electromagnetic transmission from a transmitter within an enclosed structure;
collecting first synthetic aperture data based on the first electromagnetic transmission as received at a receiver while the receiver is at a first position outside of the enclosed structure;
initiating a linear actuator to move the receiver along a track from the first position to a second position outside of the enclosed structure;
initiating transmission of a second electromagnetic transmission from the transmitter;
collecting second synthetic aperture data based on the second electromagnetic transmission as received at the receiver while the receiver is at the second position;
performing angular spectrum processing on the first synthetic aperture data and the second synthetic aperture data to generate an angle of arrival dataset;
receiving input identifying an incident angle associated with a known shielding failure;
applying, based on the input, a gating function to the angle of arrival dataset to determine a gated angle of arrival dataset; and
determining a shielding effectiveness parameter of the enclosed structure based on the gated angle of arrival dataset.

16. The non-transitory computer-readable memory of claim 15, wherein the first electromagnetic transmission is transmitted via sweeping through a plurality of frequencies in a frequency range.

17. The non-transitory computer-readable memory of claim 16, wherein the frequency range comprises frequencies between 500 MHz and 20 GHz.

18. The non-transitory computer-readable memory of claim 15, wherein the synthetic aperture data comprises a two-dimensional array of complex values, and wherein performing angular spectrum processing on the synthetic aperture comprises multiplying a one dimensional array of the complex values for a single frequency by a transform factor which is a function of a receiver location, an incident angle, a frequency, and a window function.

19. The non-transitory computer-readable memory of claim 18, wherein the first synthetic aperture data includes a first phase difference between the first electromagnetic transmission as transmitted by the transmitter and the first electromagnetic transmission as received by the receiver, and wherein the second synthetic aperture data includes a second phase difference between the second electromagnetic transmission as transmitted by the transmitter and the second electromagnetic transmission as received by the receiver.

20. The non-transitory computer-readable memory of claim 15, wherein the first synthetic aperture data includes a magnitude difference between the first electromagnetic transmission as transmitted by the transmitter and the first electromagnetic transmission as received by the receiver.

* * * * *